US007164204B2

(12) United States Patent
Yang et al.

(10) Patent No.: US 7,164,204 B2
(45) Date of Patent: Jan. 16, 2007

(54) INTEGRATED CIRCUIT DEVICES WITH AN AUXILIARY PAD FOR CONTACT HOLE ALIGNMENT

(75) Inventors: Won-suk Yang, Kyungki-do (KR); Ki-nam Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 174 days.

(21) Appl. No.: 10/770,738

(22) Filed: Feb. 3, 2004

(65) Prior Publication Data

US 2004/0155333 A1 Aug. 12, 2004

Related U.S. Application Data

(62) Division of application No. 10/171,247, filed on Jun. 12, 2002, now Pat. No. 6,699,762.

(30) Foreign Application Priority Data

Jun. 20, 2001 (KR) .............................. 2001-35110

(51) Int. Cl.
*H01L 23/52* (2006.01)

(52) U.S. Cl. ...................... 257/758; 257/773; 257/786

(58) Field of Classification Search ................ 257/382
See application file for complete search history.

(56) References Cited

U.S. PATENT DOCUMENTS 4,753,897 A * 6/1988 Lund et al. ................. 438/296
5,164,806 A 11/1992 Nagatomo et al. .......... 257/395
5,174,858 A 12/1992 Yamamoto et al. ......... 156/643
5,273,936 A 12/1993 Ikeda ......................... 438/453
5,293,503 A 3/1994 Nishigoori .................. 174/250
5,306,945 A 4/1994 Drummond
5,357,133 A 10/1994 Morita ....................... 257/316
5,365,111 A 11/1994 Ramaswami et al.
5,436,188 A 7/1995 Chen .......................... 438/397
5,441,916 A 8/1995 Motonami
5,475,266 A 12/1995 Rodder ....................... 257/750
5,550,076 A 8/1996 Chen .......................... 438/253
5,659,202 A 8/1997 Ashida ....................... 257/758
5,698,902 A 12/1997 Uehara et al. ............. 257/773
5,706,164 A 1/1998 Jeng
5,789,313 A 8/1998 Lee ............................ 438/599
5,899,742 A * 5/1999 Sun ............................ 438/682
5,932,920 A 8/1999 Kim et al. .................. 257/395
6,177,304 B1 * 1/2001 Li et al. ..................... 438/233

(Continued)

FOREIGN PATENT DOCUMENTS

DE 2724165 12/1977

(Continued)

*Primary Examiner*—Stephen W. Smoot
(74) *Attorney, Agent, or Firm*—Myers Bigel Sibley & Sajovec PA

(57) ABSTRACT

An integrated circuit device structure which avoids misalignment when a contact hole is formed to expose a contact pad and a method of fabricating the same, are provided. The integrated circuit device includes a semiconductor substrate having a conductive region and an insulating region, a contact pad on the conductive region of the semiconductor substrate, an auxiliary pad adjacent to the contact pad, and an interlevel insulating layer on the semiconductor substrate and having a contact hole for exposing both the contact pad and the auxiliary pad.

7 Claims, 2 Drawing Sheets

78
74a
74b
76
72
70

U.S. PATENT DOCUMENTS

| | | | | |
|---|---|---|---|---|
| 6,242,302 | B1 * | 6/2001 | Dennison | 438/257 |
| 6,274,409 | B1 * | 8/2001 | Choi | 438/128 |
| 6,521,933 | B1 * | 2/2003 | Miyajima et al. | 257/296 |
| 2002/0068394 | A1 * | 6/2002 | Tokushige et al. | 438/183 |

FOREIGN PATENT DOCUMENTS

| | | |
|---|---|---|
| EP | 0 523 856 A2 | 1/1993 |
| JP | 53-108391 | 9/1978 |
| JP | 59-76447 | 5/1984 |
| JP | 62-177945 | 8/1987 |
| JP | 4-63437 | 2/1992 |
| JP | 8-335701 | 2/1992 |
| JP | 9-64195 | 3/1997 |

* cited by examiner

INTEGRATED CIRCUIT DEVICES WITH AN AUXILIARY PAD FOR CONTACT HOLE ALIGNMENT

RELATED APPLICATION

This application is a divisional of U.S. application Ser. No. 10/171,247, filed Jun. 12, 2002, which issued as U.S. Pat. No. 6,699,762 and which claims priority from Korean Patent Application No. 2001-0035110, filed on Jun. 20, 2001, the contents of each of which are herein incorporated by reference in their entirety.

FIELD OF THE INVENTION

The present invention relates to integrated circuit devices and a methods of fabricating the same, and more particularly, to integrated circuit device structures and methods for forming contact holes.

BACKGROUND OF THE INVENTION

FIG. 1 is a cross-sectional view of a general semiconductor device having a self-alignment contact pad. Referring to FIG. 1, an isolation layer 12, which defines an active region, is formed in a predetermined region on a semiconductor substrate 10 through a general shallow trench isolation (STI) method. Next, a gate electrode 18 is formed on a predetermined portion of the semiconductor substrate 10 having an active region and the isolation layer 12. The gate electrode 18 can be formed by depositing a gate insulating layer 14, a conductive layer 15, a capping layer 16, and a spacer 17 which is formed along the sidewalls of the gate insulating layer 14, the conductive layer 15 and the capping layer 16, on the semiconductor substrate 10. Thereafter, a junction region 20 is formed by implanting impurities into the active region on both sides of the gate electrode 18. A contact pad 22 is formed in a self-aligned manner between the gate electrode 18 and another gate electrode to contact the junction region 20, and an interlevel insulating layer 24 is then formed on the resultant structure. A photoresist pattern exposing the contact pad 22 is formed through a conventional photolithography process on the upper surface of the interlevel insulating layer 24. A contact hole 26 is obtained by etching the exposed interlevel insulating layer 24 using the photoresist pattern as a mask. A conductive layer is then formed on the exposed contact pad 22.

As integrated circuit memory devices are made more highly integrated, the widths of the metal wirings and contact pads generally decrease in proportion to the increase in integration. Decreased widths of the metal wiring and contact pads can considerably increase the difficulty of forming a properly aligned contact hole therewith. Moreover, small contact hole areas can be difficult to fill with a conductive layer and a void may occur in the contact hole. Example misalignment of a contact hole in the interlevel insulating layer is shown in FIG. 1 by the dotted lines 28.

SUMMARY OF THE INVENTION

An integrated circuit device according to some embodiments of the present invention includes a semiconductor substrate having a conductive region and an insulating region, a conductive pad on the conductive region of the semiconductor substrate, an auxiliary pad adjacent to and electrically isolated from the conductive pad, an interlevel insulating layer on the semiconductor substrate and in which a contact hole is defined which exposes at least a portion of both the conductive pad and the auxiliary pad.

An integrated circuit device according to other embodiments of the present invention includes a semiconductor substrate having an active region and an isolation layer region, a gate electrode at a predetermined position on the semiconductor substrate, a junction region on the active region at a side of the gate electrode, a contact pad on the junction region, an auxiliary pad on the isolation layer region adjacent to the contact pad, and an interlevel insulating layer on the semiconductor substrate and in which a contact hole is defined which exposes at least a portion of the contact pad and the auxiliary pad.

An integrated circuit device according to still other embodiments of the present invention includes a semiconductor substrate having a conductive region, an underlayer on the semiconductor substrate, a primary metal wiring on the underlayer in electrical contact with the conductive region, an auxiliary metal wiring on the underlayer and adjacent to the primary metal wiring, and an interlevel insulating layer on the semiconductor substrate and in which a via hole is defined which exposes at least a portion of the primary metal wiring and the auxiliary metal wiring.

In a method of fabricating an integrated circuit device according to some embodiments of the present invention, a conductive pad is formed on the conductive region of a semiconductor substrate having a conductive region and an insulating region. An auxiliary pad is formed on a region adjacent to the conductive pad. An interlevel insulating layer is formed on the semiconductor substrate and across the conductive pad and the auxiliary pad. A contact hole is formed in the interlevel insulating layer to at least partially expose both the conductive pad and the auxiliary pad.

The contact hole or via hole can be sufficiently large to expose both the conductive pad and the auxiliary pad. To enable high integration density, the auxiliary pad **54*b* can be formed close to the conductive pad 54*a* so that it is substantially exposed by the contact hole 58. Exposing the auxiliary pad 54*b* with the contact pad 54*a* can enable the contact hole 58 to be substantially larger than the contact pad 54*a* alone and simplify alignment of a photoresist mask pattern which is used to form the contact hole 58**. A larger contact hole provides an increased contact area which in-turn can simplify subsequent processes for filling of the contact hole, such as with an upper wiring, and avoid voids within the contact hole.

The effect of misalignment when the contact hole or via hole is formed can be reduced by forming the auxiliary pad adjacent to and electrically isolated from the contact pad. In particular, the hole can be larger which can simplify alignment of a mask for forming the hole. Moreover, a larger hole can provide an increased contact area which in-turn can simplify subsequent processes for filling the hole without voids.

BRIEF DESCRIPTION OF THE DRAWINGS

The above objectives and advantages of the present invention will become more apparent by describing in detail an embodiment thereof with reference to the attached drawings in which.

DETAILED DESCRIPTION OF THE INVENTION

Figure 1:
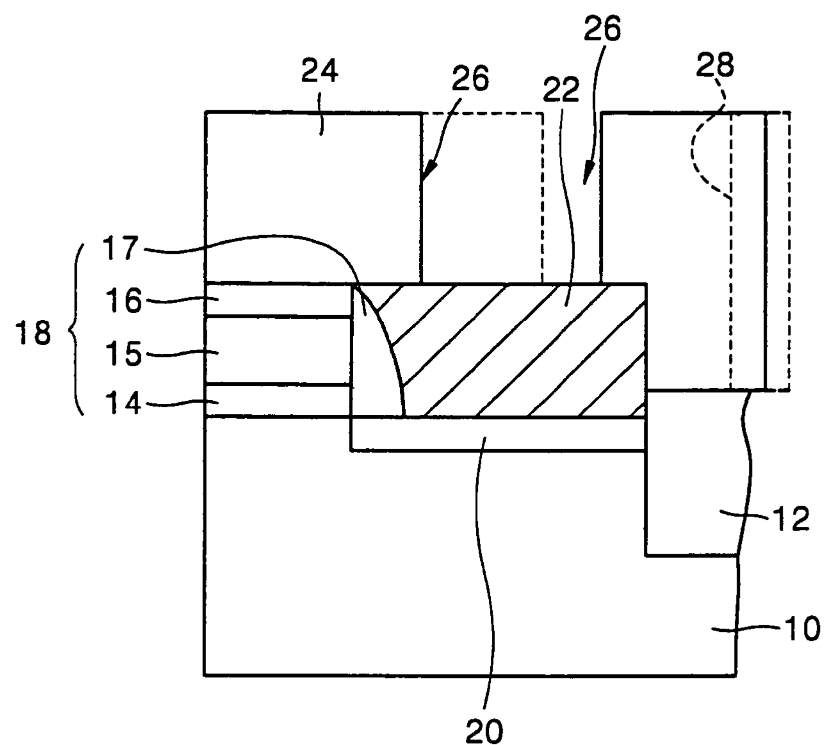
FIG. 1 is a cross-sectional view of a general integrated circuit memory device having a self-aligned contact pad.

The following description of an embodiment is provided for a person of ordinary skill in the art to fully understand the present invention. Many changes to the following embodiment are possible, and thus, the present invention is not restricted to this embodiment. The size or thickness of a layer or a film presented in the appended drawings may be somewhat exaggerated for clarity. Also, when a layer is described as being formed on another layer or a semiconductor substrate, the layer may be formed directly on the other layer or semiconductor substrate, or other layers may be interposed therebetween. Like reference numerals in the drawings denote the like members.

Figure 2:
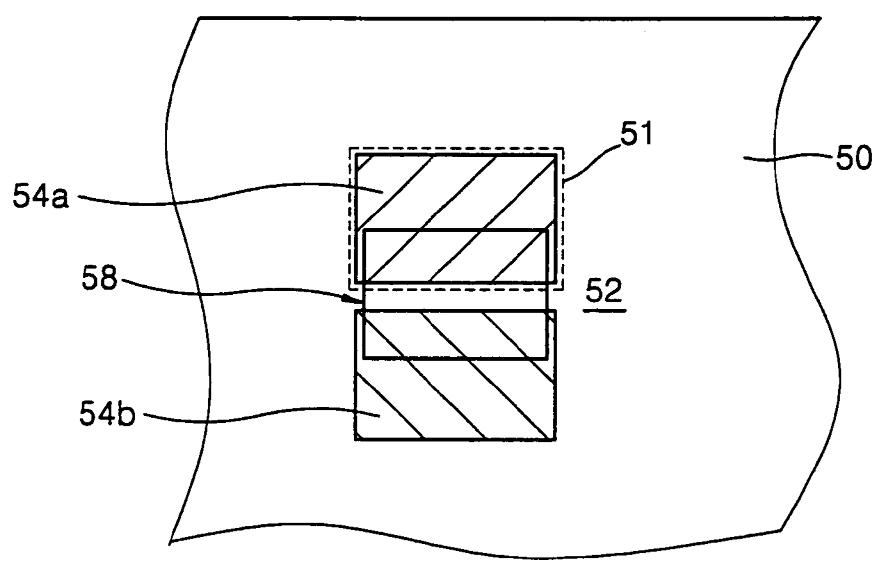
FIG. 2 is a plan view illustrating a contact structure of an integrated circuit memory device according to the present invention.

FIG. 2 is a plan view of a contact structure of an integrated circuit device according to the present invention.

Referring to FIG. 2, a conductive region 51 and an insulating region 52 are defined on a semiconductor substrate 50. The conductive region 51 can be an active region or metal wiring and the insulating region 52 can be an isolation layer or interlevel insulating layer. A conductive pad 54*a* is formed on the top of the conductive region 51.

An auxiliary pad 54*b* is formed on a region near the conductive pad 54*a*. The auxiliary pad 54*b* may be formed of the same conductive material as, and concurrently formed with, the conductive pad 54*a*. The auxiliary pad 54*b* is formed on the insulating region 52 and electrically floated thereon so as to be substantially electrically isolated form the conductive pad 54*a*. The auxiliary pad 54*b* can serve to expand the contact area available for connecting an upper wiring, which can be formed in a subsequent process, to the conductive pad 54*a*.

An interlevel insulating layer is formed on the semiconductor substrate 50 and extending across the conductive pad 54*a* and auxiliary pad 54*b* and is then etched to form a contact hole 58 which exposes the conductive pad 54*a*. The contact hole 58 can be sufficiently large to expose both the conductive pad 54*a* and the auxiliary pad 54*b*. To enable high integration density, the auxiliary pad 54*b* can be formed close to the conductive pad 54*a* so that it is substantially exposed by the contact hole 58. Exposing the auxiliary pad 54*b* with the contact pad 54*a* can enable the contact hole 58 to be substantially larger than the contact pad 54*a* alone and simplify alignment of a photoresist mask pattern which is used to form the contact hole 58. A larger contact hole provides an increased contact area which in-turn can simplify subsequent processes for filling of the contact hole, such as with an upper wiring, and avoid voids within the contact hole.

Figure 3:
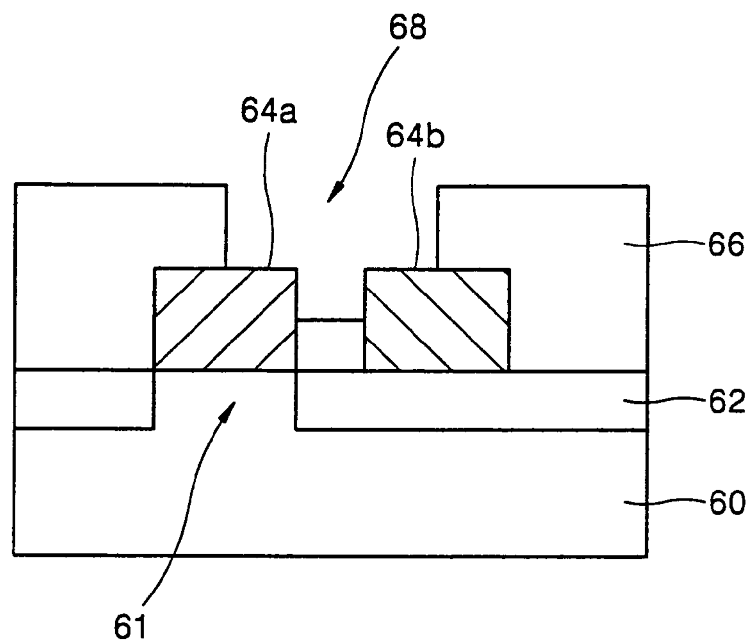
FIG. 3 is a cross-sectional view of an embodiment of the integrated circuit memory device according to the present invention.

FIG. 3 is a cross-sectional view of some embodiments of the integrated circuit memory device according to the present invention. A semiconductor substrate 60 is provided in which an active region 61 is defined by an isolation region 62 which can be formed by a shallow trench isolation (STI) process. Gate electrodes, which can include the structure as shown as 18 in FIG. 1, are formed and a conductive layer, such as a doped polysilicon film, is deposited to fill gaps between the gate electrodes. A self-aligned contact pad 64*a* is formed from the deposited conductive layer, such as by a chemical mechanical polishing (CMP) process, until the surface of the gate electrode is exposed. An auxiliary pad 64*b* is formed on the isolation layer 62 adjacent to the self-aligned contact pad 64*a* and electrically isolated therefrom. The auxiliary pad 64*b* can be formed concurrently with the forming of the contact pad 64*a*.

An interlevel insulating layer 66 is formed on the semiconductor substrate 60, the contact pad 64*a*, and the auxiliary pad 64*b*. A contact hole 68 is formed by etching the interlevel film 66 so that the self-aligned contact pad 64*a* and the auxiliary pad 64*b* are simultaneously exposed. By exposing both the self-aligned contact pad 64*a* and the auxiliary pad 64*b* the contact hole 68 can be made larger than otherwise. The larger area of the contact hole 68 can reduce the effect of misalignment and simplify subsequent processes for filling the contact hole 68, such as when forming a bit line, and avoid the formation of voids during a filing process.

Figure 4:
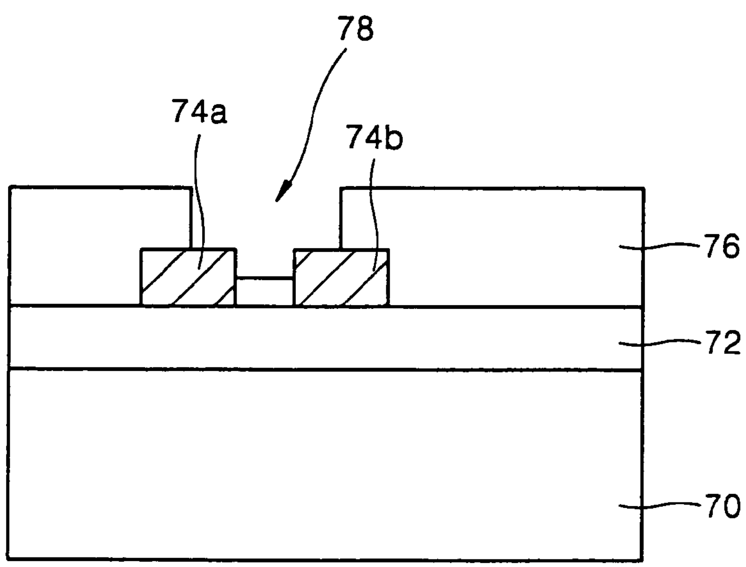
FIG. 4 is a cross-sectional view of another embodiment of the integrated circuit memory device according to the present invention.

FIG. 4 is a cross-section of an integrated circuit device according to other embodiments of the present invention. An underlayer 72 is formed on a semiconductor substrate 70. The underlayer 72 can include integrated circuit devices and wirings, however its upper surface is electrically insulated from any such devices or wirings. A primary metal wiring 74*a* is formed on the upper surface underlayer 72 and can be formed, by conventional processes, to be electrically connected to integrated circuit devices and/or wirings in the underlayer 72. In the same manner and simultaneously with the forming of the primary metal wiring 74*a*, an auxiliary wiring 74*b* is formed on the underlayer 72 adjacent to the metal wiring 74*a*. The auxiliary wiring 74*b* is formed on the underlayer 72 and electrically isolated from the primary metal wiring 74*a*.

An interlevel insulating layer 76 is formed on the semiconductor substrate 70, the metal wiring 74*a*, and the auxiliary wiring 74*b*. The interlevel insulating layer 76 is etched until predetermined portions of the metal wiring 74*a* and auxiliary wiring 74*b* are at least partially exposed, thereby forming a via hole 78. By exposing both the metal wiring 74*a*, and the auxiliary wiring 74*b* the via hole 78 can be made larger than otherwise. The larger area of the via hole 78 can reduce the effect of misalignment and simplify subsequent processes for filing the via hole 78.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An integrated circuit device comprising:

a semiconductor substrate having a conductive region and an insulating region;

an underlayer on the semiconductor substrate;

a conductive pad on the underlayer and in electrical contact with the conductive region of the semiconductor substrate, the conductive pad having a height from the semiconductor substrate;

a floating auxiliary pad on the underlayer adjacent to the conductive pad, the floating auxiliary pad having about the same height from the semiconductor substrate as the conductive pad, and the floating auxiliary pad consists of the same material as the conductive pad; and an interlevel insulating layer on the semiconductor substrate and in which a contact hole is defined which exposes at least a portion of both the conductive pad and the floating auxiliary pad, wherein the underlayer substantially electrically isolates the floating auxiliary pad from the conductive pad.

2. The integrated circuit device of claim 1, wherein the floating auxiliary pad is on the insulating region.

3. The integrated circuit device of claim 1, wherein the conductive pad and the floating auxiliary pad are the same height.

4. The integrated circuit device of claim 1, wherein the interlevel insulating layer overlaps a portion of an upper surface of the conductive pad and an upper surface of the floating auxiliary pad.

5. The integrated circuit device of claim 1, wherein the conductive pad and the floating auxiliary pad comprise respective spaced-apart portions of a common layer.

6. An integrated circuit device comprising:

a semiconductor substrate having a conductive region;

an underlayer on the semiconductor substrate;

a primary metal wiring on the underlayer and in electrical contact with the conductive region;

an auxiliary metal wiring adjacent to the primary metal wiring and on the underlayer, wherein the auxiliary metal wiring has about the same height from the semiconductor substrate as the primary metal wiring, and the auxiliary metal wiring consists of the same material as the primary metal wiring; and an interlevel insulating layer on the semiconductor substrate and in which a via hole is defined which exposes at least a portion of the primary metal wiring and the auxiliary metal wiring, wherein the underlayer substantially electrically isolates the auxiliary metal wiring from the primary metal wiring.

7. The integrated circuit device of claim 6, wherein the auxiliary metal wiring and the primary metal wiring comprise respective spaced-apart portions of a common layer.

* * * * *